(12) United States Patent
Dokumaci et al.

(10) Patent No.: US 7,205,185 B2
(45) Date of Patent: Apr. 17, 2007

(54) SELF-ALIGNED PLANAR DOUBLE-GATE PROCESS BY SELF-ALIGNED OXIDATION

(75) Inventors: Omer H. Dokumaci, Wappingers Falls, NY (US); Bruce B. Doris, Brewster, NY (US); Kathryn W. Guarini, Yorktown Heights, NY (US); Suryanarayan G. Hegde, Hollowville, NY (US); MeiKei Ieong, Wappingers Falls, NY (US); Erin Catherine Jones, Corvallis, OR (US)

(73) Assignee: International Busniess Machines Corporation, Armonk, NY (US)

( * ) Notice: Subject to any disclaimer, the term of this patent is extended or adjusted under 35 U.S.C. 154(b) by 0 days.

(21) Appl. No.: 10/663,471

(22) Filed: Sep. 15, 2003

(65) Prior Publication Data

US 2005/0059252 A1    Mar. 17, 2005

(51) Int. Cl.
  *H01L 21/336* (2006.01)
  *H01L 21/8234* (2006.01)
(52) U.S. Cl. .............. 438/197; 438/199; 438/217; 438/289; 257/250; 257/365
(58) Field of Classification Search .............. 438/706, 438/710, 723, 745, 757, 765, 766, 769, 770, 438/157, 283
  See application file for complete search history.

(56) References Cited

U.S. PATENT DOCUMENTS

| | | | |
|---|---|---|---|
| 4,346,446 A | 8/1982 | Erbstein | |
| 5,102,815 A | 4/1992 | Sanchez | |
| 5,208,472 A | 5/1993 | Su et al. | |
| 5,468,665 A | 11/1995 | Lee | |
| 5,691,212 A | 11/1997 | Tsai | |
| 5,712,173 A * | 1/1998 | Liu et al. ................ | 438/297 |
| 5,773,331 A | 6/1998 | Solomon | |
| 5,891,798 A * | 4/1999 | Doyle et al. ............ | 438/624 |
| 5,899,722 A | 5/1999 | Huang | |
| 5,902,121 A | 5/1999 | Goto | |
| 5,905,293 A | 5/1999 | Jeng | |
| 6,117,711 A * | 9/2000 | Wu ........................ | 438/154 |
| 6,339,002 B1 | 1/2002 | Chan | |
| 6,365,465 B1 | 4/2002 | Chan | |
| 6,372,559 B1 | 4/2002 | Crowder | |
| 6,465,823 B1 * | 10/2002 | Yagishita et al. ........ | 257/288 |

OTHER PUBLICATIONS

Wolf, Silicon Processing for the VLSI Era, 2002, Lattice Press, vol. 4, pp. 537-540.*

* cited by examiner

*Primary Examiner*—Duy-Vu N. Deo
(74) *Attorney, Agent, or Firm*—Scully, Scott, Murphy & Presser, P.C.; Ido Tuchman, Esq.

(57) ABSTRACT

A double-gate transistor has front (upper) and back gates aligned laterally by a process of forming symmetric sidewalls in proximity to the front gate and then oxidizing the back gate electrode at a temperature of at least 1000 degrees for a time sufficient to relieve stress in the structure, the oxide penetrating from the side of the transistor body to thicken the back gate oxide on the outer edges, leaving an effective thickness of gate oxide at the center, aligned with the front gate electrode. Optionally, an angled implant from the sides of an oxide enhancing species encourages relatively thicker oxide in the outer implanted areas and an oxide-retarding implant across the transistor body retards oxidation in the vertical direction, thereby permitting increase of the lateral extent of the oxidation.

18 Claims, 4 Drawing Sheets

SELF-ALIGNED PLANAR DOUBLE-GATE PROCESS BY SELF-ALIGNED OXIDATION

TECHNICAL FIELD

The field of the invention is that of forming dual-gate transistors in integrated circuit processing, in particular self-aligned dual gate transistors.

BACKGROUND OF THE INVENTION

Workers in the field of integrated circuits are constantly striving to reduce the size of devices, in particular transistors.

As FET dimensions are scaled down, it becomes increasingly difficult to control short-channel effects by conventional means. Short-channel effects well known to those skilled in the art are the decrease in threshold voltage Vt, in short-channel devices, i.e. sub-0.1 micron, due to two-dimensional electrostatic charge sharing between the gate and the source/drain region.

An evolution beyond the standard single gate metal oxide semiconductor field effect transistor (MOSFET) is the double-gate MOSFET, in which the device channel is confined between top and bottom gate dielectric layers.

This structure, with a symmetrical gate structure, can be scaled to about half of the channel length as compared with a conventional single gate MOSFET structure. It is well known that a dual gate or double-gate MOSFET device has several advantages over conventional single gate MOSFET devices. Specifically, the advantages over conventional single gate counterparts include: a higher transconductance, and improved short-channel effects.

For instance, Monte Carlo simulation has been carried out on a 30 nm channel dual-gate MOSFET device and has shown that the dual gate device has a very high transconductance (2300 mS/nm) and fast switching speeds (1.1 ps for nMOSFET).

Moreover, improved short channel characteristics are obtained down to 20 nm channel length with no doping needed in the channel region. This circumvents the tunneling breakdown, dopant quantization, and dopant depletion problems associated with channel doping that are normally present with single gate MOSFET devices.

Currently, both vertical and horizontal gate structures are actively being pursued by many workers in the field. The horizontal gate structure has several advantages over the vertical structures due to the similarity of current state of the art CMOS devices. However, one major and formidable challenge of fabricating the double gate is aligning the bottom gate to the top gate.

SUMMARY OF THE INVENTION

The invention relates to an integrated circuit having dual-gate transistors.

An aspect of the invention is the formation of a self-aligned back gate by oxidizing a portion of the back gate electrode layer using the front gate as an oxidation mask.

Another aspect of the invention is the implantation at the outer edges of the structure of a species that promotes oxidation.

Another aspect of the invention is the oxidation for a sufficient time and temperature to reduce stress in the transistor body.

Another aspect of the invention is the transverse extent of the oxidation to extend the boundary of the back gate below the edge of the transistor body.

Another aspect of the invention is the formation of raised source and drain structures within a space left by the spacers that define the width of the transistor body.

DETAILED DESCRIPTION

Figure 1A:
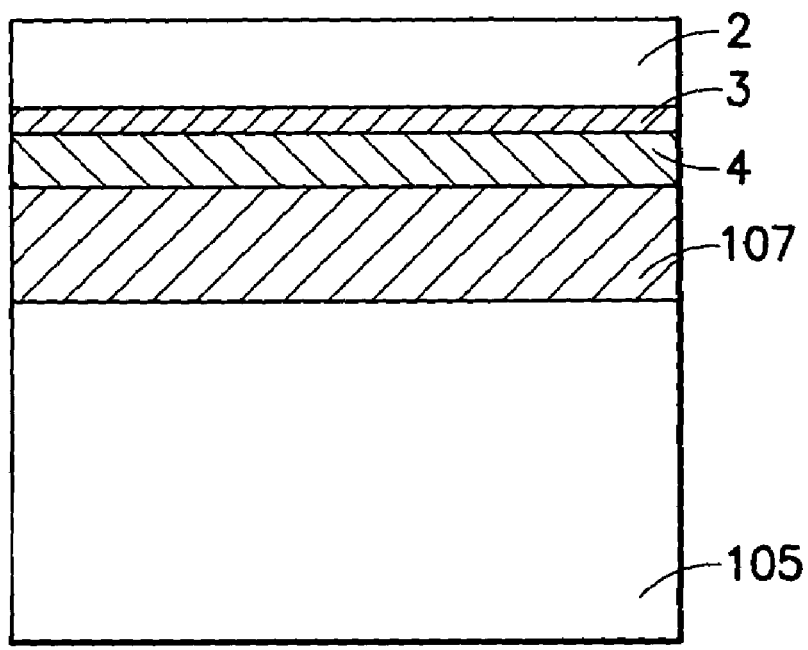
FIGS. 1A and 1B show steps in the formation of the original unpatterned structure.

FIG. 1A shows an initial SOI wafer having bulk substrate 105, with buried oxide (BOX) 107 separating the bulk substrate from the single-crystal silicon SOI layer 4 that will become the transistor body. Layer 4 has a nominal thickness that may range from 2 nm to 50 nm.

A layer of thermal oxide 3 that will become the back gate dielectric is grown on silicon layer 4 to a thickness of 1 nm to 3 nm and a layer of polycrystalline silicon (poly) 2 is deposited by CVD in the range of 100 nm to 400 nm that will become the back gate electrode. Layer 3 may be composed of oxynitride or may be nitridized as a design choice, so long as it is suitable for a gate dielectric.

Figure 1B:
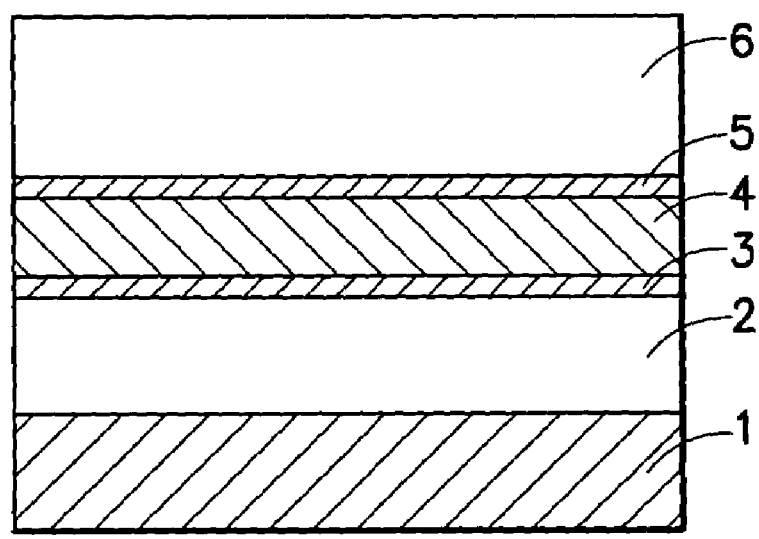

FIG. 1B shows the result of bonding a second, bulk wafer to the first one and removing substrate 105, e.g. by grinding and BOX layer 7, e.g. by etching in dilute hydrofluoric acid. The new substrate is denoted with the numeral 1 in FIG. 1B.

Layer 4 is oxidized again with a thermal oxide 5 that will become the front gate dielectric. Layer 5 may also be oxynitride or may be nitridized. It may also optionally be a high dielectric material such as $ZrO_2$, $HfO_2$, $AlO_2$ or other conventional high-k material. Another poly layer 6 is deposited by CVD, preferably in the range of 70 nm to 250 nm in thickness.

Figure 2:
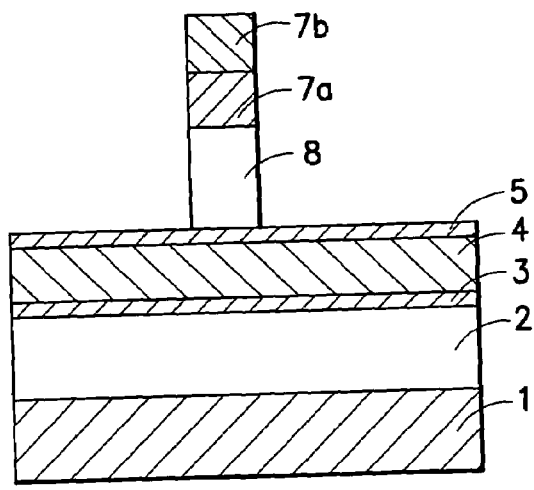
FIG. 2 shows a front gate electrode.

FIG. 2 shows the result of depositing on poly layer 6 a pair of first and second pattern transfer layers, illustratively layer 7a of 10 nm to 70 nm of oxide ($SiO_2$) and layer 7b of 10 nm to 70 nm of nitride ($Si_3N_4$). A layer of photoresist is deposited and patterned to define the front gate. The pattern transfer layers are etched to define a hardmask and the resist is stripped. Poly layer 6 is etched using the hardmask as a pattern to form first (front) gate 8.

Figure 3:
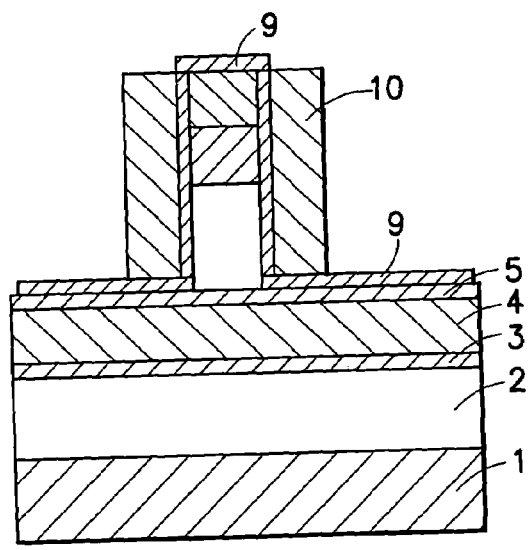
FIG. 3 shows the formation of a first pair of spacers defining the transistor body.

FIG. 3 shows the result of depositing and defining layers that will protect first gate 8 during the formation of the second or back gate. A conformal oxide layer 9 is deposited, illustratively of CVD TEOS 2 nm to 10 nm in thickness. Next, a CVD nitride film 10 nm to 100 nm thick is deposited. The nitride film is etched in a conventional directional etch to remove the film on horizontal surfaces to form nitride spacers 10, stopping the etch on oxide film 9.

Figure 4:
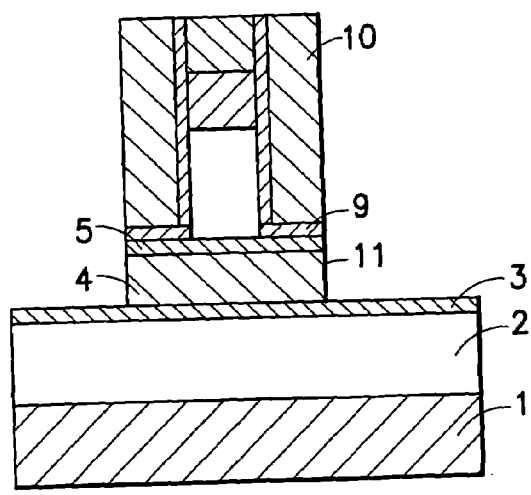
FIG. 4 shows the result of etching the SOI layer to define the transistor body.

FIG. 4 shows the result of performing another directional etch on layer 9 and gate layer 5, e.g. with HBr chemistry and a directional etch that removes silicon selectively to oxide (e.g. HBr chemistry) to etch through layer 4, stopping on layer 3. The preceding directional etches are conventional and generically described as reactive ion etches.

The result is that the transistor body has been defined to extend past the first gate electrode on both the left and right in the figure by the thickness of spacers 9 and 10. Spacers 9 and 10 will be referred to as being in proximity to the gate and to the vertical edge of the transistor body, meaning that they are close to the referenced structure but not necessarily directly in contact with it. Additional liners may be deposited as an etch stop or as an insulator to remain in the final structure. The vertical edge of the transistor body is denoted with numeral 11 in this figure and will be contacted by additional silicon added in a later stage. The thickness of the transistor body perpendicular to the plane of the paper will be set according to the designed current capacity of the transistor, as is conventional.

Optionally, an extra space may be allowed in front of or behind the plane of the paper to make contact with the lower gate electrode that will be formed from layer 2.

Figure 5:
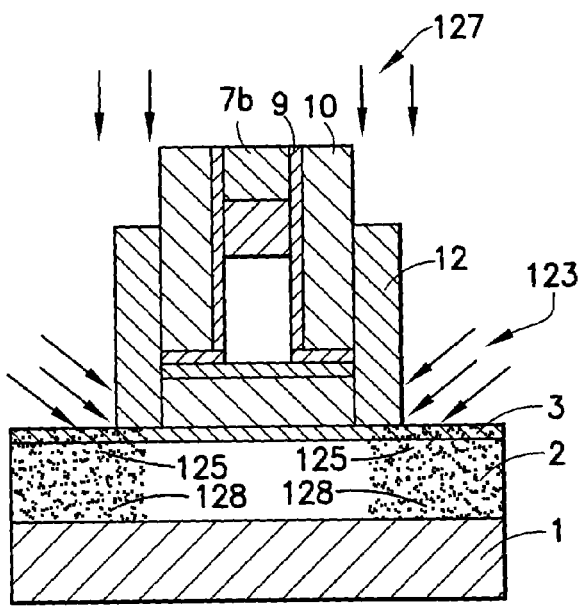
FIG. 5 shows the formation of a second pair of spacers that protect the transistor body during oxidation.

FIG. 5 shows the result of depositing a conformal layer of CVD nitride and etching it directionally to form spacers 12 that protect the vertical edge of the transistor body and also define the boundary of the area in layer 2 that will be oxidized in the following step.

Figure 6:
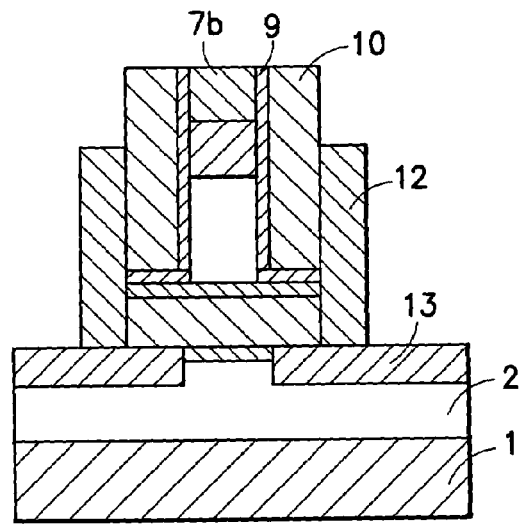
FIG. 6 shows the result of the oxidation that defines the width of the back gate electrode.

Illustratively, as shown in FIG. 6, the thickness of spacers 10 and 12 are set to facilitate the following oxidation step, in which layer 2 is oxidized through oxide layer 3, so that only the central unoxidized portion functions as the back gate electrode. In this drawing, and in the remaining drawings of the instant application, reference numeral 13 denotes an oxidized portion of the back gate electrode.

Those skilled in the art would not think to exploit the transverse growth of oxide to penetrate under the transistor body because the expansion in volume of the oxide compared with silicon would have been though to delaminate or to exert undesired stress on the transistor body.

Advantageously, it has been found that the transverse oxide growth is rapid enough in the poly layer 2 that the resulting stress is acceptable. In addition, it has been found that if the oxidation is performed at a temperature of about 1000 C. or greater for a time of about 20 min or greater, that the stress caused by the oxidation is relaxed since the SiO2 is more viscous under these conditions.

The parameters of the oxidation step are adjusted empirically to provide for the correct amount of sideways growth. Optionally, an angled ion implant of phosphorus or other oxide-promoting species, indicated schematically by arrows 123 in FIG. 5 and by shaded area 125, can be used prior to the oxidation to facilitate and control the lateral oxidation extent. The angle with respect to the wafer normal will depend on the height and spacing of nearby structures. The dose and voltage will be set empirically. Greater lateral penetration can be achieved by increasing the voltage.

Alternatively, or additionally, a nitrogen (or other oxide-retarding species) implant, indicated schematically by arrows 127 and shaded area 128 in FIG. 5, may be performed at a normal incidence angle. The back gate electrode with a sufficient amount of nitrogen incorporation will retard the oxidation in the vertical direction thereby enabling more control and flexibility over the vertical to lateral oxidation extent. The voltage can be set to leave a light dose near the top of layer 2 and a retarding dose in the lower portion.

The oxide penetrates a nominal 30–70 nm sideways toward the central portion and a nominal 30–70 nm downward.

Figure 7:
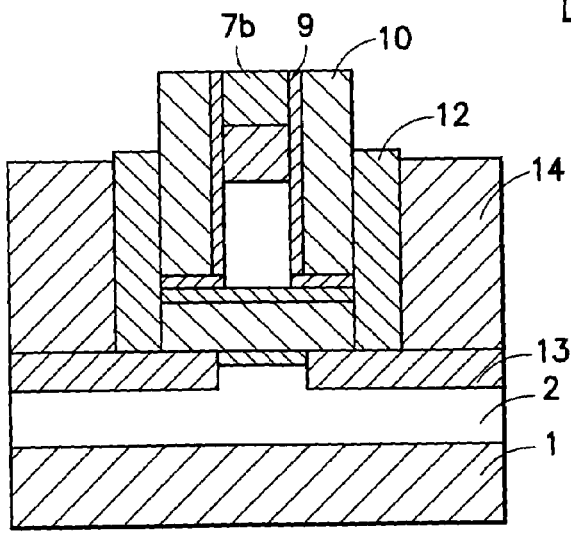
FIG. 7 shows the result of depositing dielectric enclosing the transistor structure.

FIG. 7 shows the result of depositing a CVD oxide film 14 to a thickness nominally greater than the height of the gate stack (plus layers 7a and 7b), that is then planarized, e.g. in a chemical-mechanical polishing (CMP) process.

After planarization, the oxide is recessed to a height less than the height of the gate stack (and greater than the height of gate 8).

Figure 8:
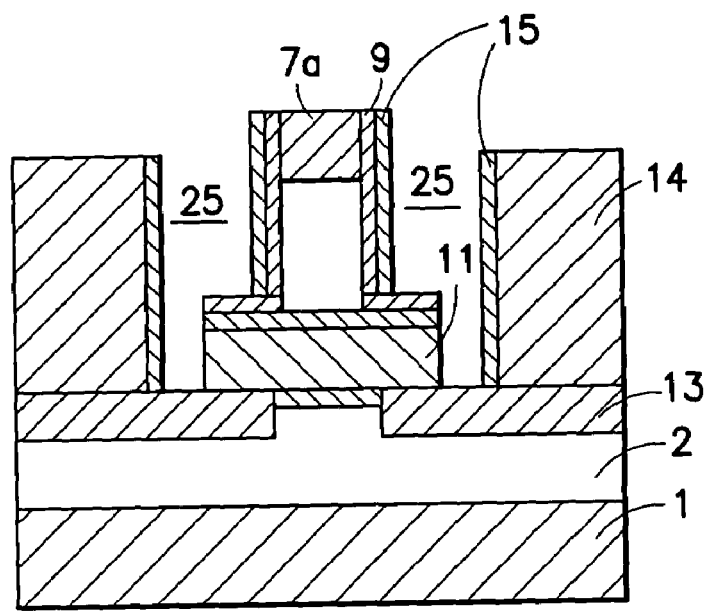
FIG. 8 shows the result of stripping the spacers to form an aperture holding the raised S/D structures.

FIG. 8 shows the result of stripping the spacers 10 and 12 and cap 7b, e.g. in hot phosphoric acid, to open an aperture 25 for the raised source-/drain structures. Another nitride spacer 15, having a nominal thickness of 10–70 nm, is formed on the vertical surfaces of the aperture to isolate the S/D contacts from the gate. An implant of conventional magnitude for the S/D may be performed in aperture 25 at this time. The completion of the S/D, whether at this time or after the raised S/D step shown in FIG. 9, completes the transistor.

A conventional cleaning step (preferably wet cleaning) removes any residue from vertical surfaces 11 of the transistor body to make a good contact between the body and the raised S/D structures.

Figure 9:
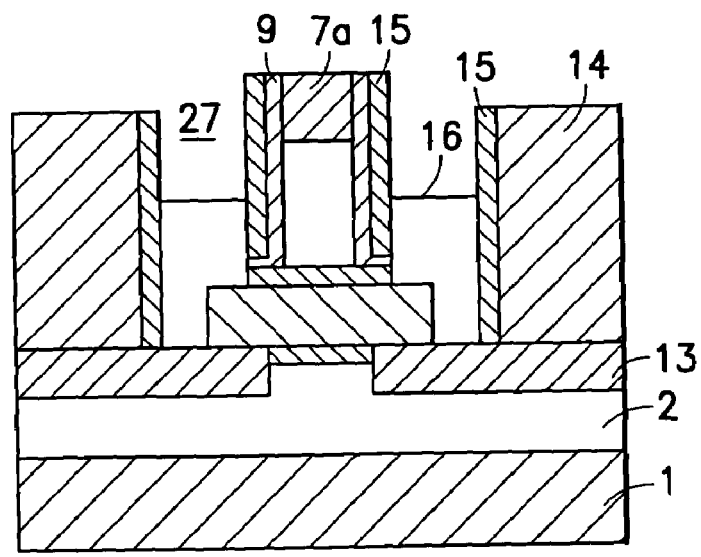
FIG. 9 shows the raised S/D contacts with isolating dielectric to insulate the S/D contacts.

FIG. 9 shows the result of filling aperture 25 with silicon 16—by selective epitaxy, or by deposition of amorphous silicon or poly (with or without a S/D implant). A planarization, e.g. CMP followed by a dry etch to recess the silicon results in the structure shown, in which apertures 27 are prepared for the deposition of a conventional interconnect to connect transistors to form the circuit.

Conventional middle of the line and back of the line steps are performed to complete the circuit, referred to for convenience as completing the circuit.

The layers that form gate electrodes 2 and 8 are put down with conventional dopant concentrations (or implanted later) sufficient to provide the proper conductivity for the gates. Similarly, the raised S/D structures have the proper amount of dopant added during deposition.

Layer 4 that forms the transistor body may have a conventional dopant concentration. Those skilled in the art are aware of the type and concentration of dopants to form NFETs and PFETs.

Process Flow
Initial Wafer Preparation
   Start with SOI wafer with silicon SOI layer
   Thermal oxide for back gate dielectric
   Poly for back gate electrode
Bond Carrier Wafer
   Remove initial substrate
   Remove initial BOX
Front gate dielectric
Front gate electrode
Gate Patterning
   Pattern transfer layer 1 (oxide)
   Pattern transfer layer 2 (nitride)
   Pattern front gate
First Spacer Formation
   Deposit Etch stop layer
   Deposit Spacer layer
   Directional etch to form spacers
Channel Patterning
   Etch pattern transfer layer 1
   Etch channel, stopping on back oxide Second Spacer Formation
  Deposit spacer material
  Define spacers
Define Self-Aligned Back Gate
  Oxidize Back Gate Layer, extending oxidation horizontally to define self-aligned gate
Deposit Thick dielectric, planarize
Remove First and Second Spacers
Gate Isolation Spacers
S/D Contact Deposition While the invention has been described in terms of a single preferred embodiment, those skilled in the art will recognize that the invention can be practiced in various versions within the spirit and scope of the following claims.

What is claimed is:

1. A method of forming a double-gate transistor comprising the steps of:
   providing a semiconductor wafer having a substrate and a device layer, a back gate dielectric layer adjacent to and below said device layer, a back gate electrode between said back gate dielectric layer and said substrate, a front gate dielectric on said device layer and a front gate electrode layer on said front gate dielectric layer;
   depositing at least one transfer layer on said front gate electrode layer,
   patterning said at least one transfer layer with a gate pattern and forming a first gate in said front gate electrode layer using said transfer layer as a mask;
   forming at least one vertical spacer layer adjacent to opposite sides of said front gate;
   etching said device layer using said at least one spacer layer as a mask to form a transistor body disposed on said back gate dielectric layer;
   oxidizing said back gate electrode such that oxide is formed below said transistor body and on either side of a central portion of said back gate electrode, thereby forming said back gate self-aligned with said front gate; and
   forming source and drain electrodes on opposite sides of said transistor body.

2. A method according to claim 1, in which said step of forming at least one vertical spacer comprises forming a first vertical spacer in proximity to said front gate and having a bottom surface above said transistor body;
   thereafter performing said step of etching said device layer to form said transistor body; and forming a second spacer in proximity to a vertical edge of said transistor body.

3. A method according to claim 2, in which said step of oxidizing said back gate electrode is performed with said second vertical spacer disposed in proximity to a vertical edge of said transistor body, thereby defining a lateral extent of oxidation by the thickness of said second vertical spacer, said oxidation extending underneath said vertical spacer and said transistor body and into said back gate electrode.

4. A method according to claim 3, further comprising a step of performing an angled implantation into said back gate electrode of an ion species that promotes oxidation before said step of oxidation, thereby increasing the rate of oxidation in the implanted area.

5. A method according to claim 2, in which said step of oxidizing is conducted at a temperature of at least 1000 degrees Centigrade for at least twenty minutes.

6. A method according to claim 2, further comprising a step of performing an angled implantation into said back gate electrode of an ion species that promotes oxidation before said step of oxidation, thereby increasing the rate of oxidation in the implanted area.

7. A method according to claim 1, in which said step of oxidizing said back gate electrode is performed with at least one vertical spacer disposed in proximity to a vertical edge of said transistor body, thereby defining a lateral extent of oxidation by the thickness of said vertical spacer, said oxidation extending underneath said vertical spacer and said transistor body and into said back gate electrode.

8. A method according to claim 1, further comprising a step of depositing a layer of interlevel dielectric about said transistor up to at least the top of said front gate, stripping said second vertical spacer, thereby forming an aperture over the source and drain of said transistor, and depositing a conductive material in said aperture, thereby forming a raised S/D structure.

9. A method according to claim 1, in which said step of oxidizing is conducted at a temperature of at least 1000 degrees Centigrade for a time sufficient to reduce stress in said transistor body.

10. A method according to claim 9, further comprising a step of performing an angled implantation into said back gate electrode of an ion species that promotes oxidation before said step of oxidation, thereby increasing the rate of oxidation in the implanted area.

11. A method according to claim 9, further comprising a step of performing a vertical implantation into said back gate electrode of an ion species that retards oxidation before said step of oxidation, thereby decreasing the rate of oxidation in the vertical direction.

12. A method according to claim 1, further comprising a step of performing an angled implantation into said back gate electrode of an ion species that promotes oxidation before said step of oxidation, thereby increasing the rate of oxidation in the implanted area.

13. A method according to claim 1, in which said step of oxidizing is conducted at a temperature of at least 1000 degrees Centigrade for at least twenty minutes.

14. A method according to claim 13, further comprising a step of performing an angled implantation into said back gate electrode of an ion species that promotes oxidation before said step of oxidation, thereby increasing the rate of oxidation in the implanted area.

15. A method according to claim 14, further comprising a step of performing a vertical implantation into said back gate electrode of an ion species that retards oxidation before said step of oxidation, thereby decreasing the rate of oxidation in the vertical direction.

16. A method according to claim 13, further comprising a step of performing a vertical implantation into said back gate electrode of an ion species that retards oxidation before said step of oxidation, thereby decreasing the rate of oxidation in the vertical direction.

17. A method according to claim 1, further comprising a step of performing a vertical implantation into said back gate electrode of an ion species that retards oxidation before said step of oxidation, thereby decreasing the rate of oxidation in the vertical direction.

18. A method of forming a double-gate transistor comprising the steps of:
   providing an SOI wafer having a first substrate, a BOX layer and a device layer;
   forming a back gate dielectric layer on said device layer;
   forming a back gate electrode on said back gate dielectric layer;
   bonding a second wafer having a second substrate to said back gate electrode of said SOI wafer;

removing said first substrate;

removing said BOX layer;

forming a front gate dielectric on said device layer;

forming a front gate electrode layer on said front gate dielectric layer;

depositing at least one transfer layer on said front gate dielectric;

patterning said at least one transfer layer with a gate pattern and forming a first gate in said front gate electrode layer;

forming at least one vertical spacer layer adjacent to opposite sides of said first gate;

etching said device layer using said at least one spacer layer as a mask to form a transistor body disposed on said back gate dielectric layer;

oxidizing said back gate electrode such that oxide is formed below said transistor body and on either side of a central portion of said back gate electrode, thereby forming said back gate self-aligned with said first gate; and forming source and drain electrodes on opposite sides of said transistor body.

* * * * *